United States Patent
Middleton et al.

(10) Patent No.: US 10,158,077 B2
(45) Date of Patent: Dec. 18, 2018

(54) LIGHT EMITTING COMPOSITION AND DEVICE

(71) Applicants: CAMBRIDGE DISPLAY TECHNOLOGY LIMITED, Cambridgeshire (GB); SUMITOMO CHEMICAL COMPANY LIMITED, Tokyo (JP)

(72) Inventors: Helen Middleton, Nottingham (GB); Martin Humphries, Cambridge (GB); Richard Wilson, Cambridge (GB)

(73) Assignees: CAMBRIDGE DISPLAY TECHNOLOGY LIMITED, Cambridgeshire (GB); SUMITOMO CHEMICAL COMPANY LIMITED, Tokyo (JP)

( * ) Notice: Subject to any disclaimer, the term of this patent is extended or adjusted under 35 U.S.C. 154(b) by 1102 days.

(21) Appl. No.: 14/367,855

(22) PCT Filed: Dec. 20, 2012

(86) PCT No.: PCT/GB2012/000920
§ 371 (c)(1),
(2) Date: Jun. 20, 2014

(87) PCT Pub. No.: WO2013/093400
PCT Pub. Date: Jun. 27, 2013

(65) Prior Publication Data
US 2014/0346486 A1 Nov. 27, 2014

(30) Foreign Application Priority Data

Dec. 23, 2011 (GB) .................................. 1122316.1
May 16, 2012 (GB) .................................. 1208610.4
May 29, 2012 (GB) .................................. 1209536.0

(51) Int. Cl.
| | |
|---|---|
| *H01L 51/00* | (2006.01) |
| *C09K 11/06* | (2006.01) |
| *C08G 61/12* | (2006.01) |
| *C09J 165/00* | (2006.01) |
| *H01L 51/50* | (2006.01) |
| *C08L 65/00* | (2006.01) |

(52) U.S. Cl.
CPC .......... *H01L 51/0034* (2013.01); *C08G 61/12* (2013.01); *C09J 165/00* (2013.01); *C09K 11/06* (2013.01); *H01L 51/0035* (2013.01); *H01L 51/0039* (2013.01); *H01L 51/0043* (2013.01); *H01L 51/0085* (2013.01); *C08G 2261/124* (2013.01); *C08G 2261/148* (2013.01); *C08G 2261/1412* (2013.01); *C08G 2261/1424* (2013.01); *C08G 2261/1624* (2013.01); *C08G 2261/312* (2013.01); *C08G 2261/3142* (2013.01); *C08G 2261/3162* (2013.01); *C08G 2261/334* (2013.01); *C08G 2261/344* (2013.01); *C08G 2261/364* (2013.01); *C08G 2261/411* (2013.01); *C08G 2261/5222* (2013.01); *C08G 2261/5242* (2013.01); *C08G 2261/95* (2013.01); *C08L 65/00* (2013.01); *C09K 2211/1433* (2013.01); *C09K 2211/1475* (2013.01); *C09K 2211/185* (2013.01); *H01L 51/5016* (2013.01); *H01L 51/5024* (2013.01); *H01L 51/5032* (2013.01)

(58) Field of Classification Search
CPC ............ H01L 51/0034; H01L 51/0035; H01L 51/0039; H01L 51/0043; H01L 51/0085; H01L 51/5016; H01L 51/5024; H01L 51/5032; C08G 61/12; C09J 165/00; C09K 11/06
See application file for complete search history.

(56) References Cited

U.S. PATENT DOCUMENTS

| | | |
|---|---|---|
| 5,723,873 A | 3/1998 | Yang |
| 5,798,170 A | 8/1998 | Zhang et al. |

(Continued)

FOREIGN PATENT DOCUMENTS

| | | |
|---|---|---|
| EP | 0 880 303 A1 | 11/1998 |
| EP | 0 901 176 A2 | 3/1999 |

(Continued)

OTHER PUBLICATIONS

F. Huang et al., 19 Advanced Functional Materials, 2457-2466 (2009).*

(Continued)

*Primary Examiner* — Alexander R Pagano
(74) *Attorney, Agent, or Firm* — Marshall, Gerstein & Borun LLP

(57) ABSTRACT

A light-emitting composition comprises a polymer and a phosphorescent light-emitting material. The polymer comprises conjugating repeat units of formula (I) and up to 20 mol % of conjugation-blocking repeat units of repeat units of formula (II):

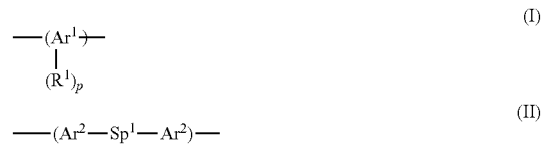

$Ar^1$ represents an aryl or heteroaryl group; $R^1$, which may be the same or different in each occurrence, is a substituent; p is 0 or an integer; $Ar^2$ in each occurrence independently represents a substituted or unsubstituted aryl or heteroaryl group; and $Sp^1$ represents an acyclic spacer group that does not provide any conjugation path between the two groups $Ar^2$. Optionally, p is 0, 1, 2, 3 or 4 and each $R^1$ is a non-polar substituent. Each $R^1$ is advantageously selected from $C_{1-30}$ hydrocarbyl substituents. A light-emitting device comprises an anode, a cathode and a light-emitting layer between the anode and the cathode, the light-emitting layer comprising a light-emitting composition as described.

17 Claims, 3 Drawing Sheets

(56) References Cited

U.S. PATENT DOCUMENTS

| | | | |
|---|---|---|---|
| 5,900,327 A | 5/1999 | Pei et al. | |
| 6,953,628 B2 | 10/2005 | Kamatani et al. | |
| 7,030,138 B2 | 4/2006 | Fujimoto et al. | |
| 7,030,555 B2* | 4/2006 | Nakamura | H01L 51/5036 |
| | | | 313/504 |
| 7,125,998 B2 | 10/2006 | Stossel et al. | |
| 7,323,533 B2* | 1/2008 | Becker | C08G 61/02 |
| | | | 252/582 |
| 7,527,879 B2 | 5/2009 | Kamatani et al. | |
| 7,638,594 B2* | 12/2009 | Becker | C08G 61/02 |
| | | | 252/582 |
| 7,723,455 B2* | 5/2010 | Becker | C08G 61/02 |
| | | | 528/4 |
| 8,008,418 B2* | 8/2011 | Morishita | C08G 61/124 |
| | | | 528/229 |
| 9,382,253 B2* | 7/2016 | Stoessel | C07C 49/796 |
| 2002/0117662 A1 | 8/2002 | Nii | |
| 2002/0182441 A1 | 12/2002 | Lamansky et al. | |
| 2004/0183963 A1* | 9/2004 | Nakamura | H01L 27/322 |
| | | | 349/69 |
| 2010/0240856 A1 | 9/2010 | Veinot et al. | |
| 2012/0326140 A1* | 12/2012 | Fukushima | C08G 61/12 |
| | | | 257/40 |

FOREIGN PATENT DOCUMENTS

| | | |
|---|---|---|
| EP | 0 947 123 A1 | 10/1999 |
| EP | 1 245 659 | 10/2002 |
| GB | 2 348 316 A | 9/2000 |
| JP | 2002-324679 A | 11/2002 |
| WO | WO-98/10621 A1 | 3/1998 |
| WO | WO-98/57381 A1 | 12/1998 |
| WO | WO-00/48258 A1 | 8/2000 |
| WO | WO-00/53656 A1 | 9/2000 |
| WO | WO-02/44189 A1 | 6/2002 |
| WO | WO-02/45466 A1 | 6/2002 |
| WO | WO-02/66552 A1 | 8/2002 |
| WO | WO-02/68435 A1 | 9/2002 |
| WO | WO-02/81448 A1 | 10/2002 |
| WO | WO-02/84759 A1 | 10/2002 |
| WO | WO-2005/013386 A2 | 2/2005 | |
| WO | WO-2010/065178 A1 | 6/2010 | |
| WO | WO-2011093428 A1 * | 8/2011 | C08G 61/12 |
| WO | WO-2011/141709 A1 | 11/2011 | |
| WO | WO-2011/141714 A1 | 11/2011 | |

OTHER PUBLICATIONS

J. March, Advanced Organic Chemistry Reactions, Mechanisms and Structure 273-292 (4th ed., 1992).*

Adachi et al., "High-Efficiency Organic Electrophosphorescent Devices with Tris(2-phenylpyridine)iridium Doped into Electron-Transporting Materials," *Appl. Phys. Lett.*, 77:904 (2000).

Huang et al., "Water/Alcohol Soluble Conjugated Polymers as Highly Efficient Electron Transporting/Injection Layer in Optoelectronic Devices," *Chem. Soc. Rev.*, 39(7):2500-2513 (2010).

Lee et al., "Semiperfluoralkyl Polyfluorenes for Orthogonal Processing in Fluorous Solvents," *Macromolecules*, 43(3):1195-1198 (2010).

Michaelson, "The work function of the elements and its periodicity", *J. Applied Physics*, 48(11): 4729-4733 (1977).

Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

Tang et al., "Electroluminescence of Doped Organic Thin Films," *Journal of Applied Physics*, 65(9):3610-3616 (1989).

Tokito et al., "Metal oxides as a hole-injecting layer for an organic electroluminescent device", *J. Phys. D: Appl. Phys.*, 29:2750-2753 (1996).

Yamamoto, "Electrically Conducting and Thermally Stable π-Conjugated Poly(Arylene)s Prepared by Organometallic Processes," *Prog. Polym. Sci.*, 17:1153-1205 (1993).

Zhang et al., "Highly Efficient Blue Polyfluorene-Based Polymer Light-Emitting Diodes Through Solvent Vapour Annealing," *Journal of Phys. D. Appl. Phys.*, 42(14):145104 (2009).

International Preliminary Report on Patentability for Application No. PCT/GB2012/000920, dated Jun. 24, 2014.

International Search Report and Written Opinion for Application No. PCT/GB2012/000920, dated Jun. 6, 2013.

* cited by examiner

LIGHT EMITTING COMPOSITION AND DEVICE

BACKGROUND

Electronic devices comprising active organic materials are attracting increasing attention for use in devices such as organic light emitting diodes, organic photoresponsive devices (in particular organic photovoltaic devices and organic photosensors), organic transistors and memory array devices. Devices comprising organic materials offer benefits such as low weight, low power consumption and flexibility. Moreover, use of soluble organic materials allows use of solution processing in device manufacture, for example inkjet printing or spin-coating.

An organic light-emitting device (OLED) may comprise a substrate carrying an anode, a cathode and an organic light-emitting layer between the anode and cathode comprising a light-emitting material. Further layers may be provided between the anode and the cathode, for example one or more charge-injection or charge-transport layers.

During operation of the device, holes are injected into the device through the anode and electrons are injected through the cathode. Holes in the highest occupied molecular orbital (HOMO) and electrons in the lowest unoccupied molecular orbital (LUMO) of the light-emitting material combine in the light-emitting layer to form an exciton that releases its energy as light.

A light-emitting electrochemical cell (LEC) may have a structure similar to that of an OLED, and further has mobile ions in the light-emitting layer, which may be provided in the form of a salt and an ion-conducting polymer blended with a light-emitting material. The cations and anions of the salt may respectively p- and n-dope the light-emitting material, which may provide for a low drive voltage.

U.S. Pat. No. 5,900,327 discloses a LEC comprising the polymer BDOH-PF:

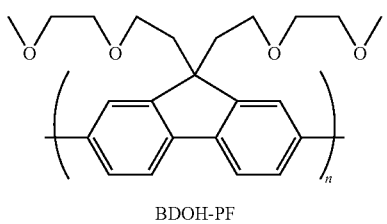

BDOH-PF

The ethylene oxide side groups of BDOH-PF are said to improve compatibility with the ion-conducting polymer poly(ethylene oxide) and increase solubility of the polymer in common organic solvents.

Suitable light-emitting materials include small molecule, polymeric and dendrimeric materials. Suitable light-emitting polymers for use in the light-emitting layer include poly(arylene vinylenes) such as poly(p-phenylene vinylenes) and polyarylenes such as polyfluorenes.

The light emitting layer may contain a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton) and Appl. Phys. Lett., 2000, 77, 904 discloses a host material doped with a phosphorescent light emitting dopant (that is, a light-emitting material in which light is emitted via decay of a triplet exciton).

Hosts for luminescent dopants include "small molecule" materials such as tris-(8-hydroxyquinoline)aluminium ("Alq3") and non-conjugated polymers such as polyvinyl-carbazole ("PVK").

Conjugated polymers (that is, polymers in which adjacent repeat units in the polymer backbone are conjugated together) may also be used as host materials. Such conjugated polymers may possess numerous advantageous properties such as solubility, which allows the material to be deposited by solution coating or printing techniques, including processes such as spin-coating or inkjet printing, and high conductivity.

WO 2005/013386 discloses an organic light-emitting device comprising a host polymer material and a luminescent metal complex wherein the polymer material may comprise non-planar repeat units or partially or fully non-conjugated repeat units in order to reduce conjugation of the polymer.

WO 2011/141709 discloses a light-emitting composition comprising a host polymer and a light-emitting dopant wherein the host polymer comprises conjugating repeat units and non-conjugating repeat units, and wherein the non-conjugating repeat units comprise an at least partially saturated ring. The presence of the non-conjugating repeat units is stated to increase the HOMO-LUMO bandgap of the polymer.

SUMMARY OF THE INVENTION

In a first aspect, the invention provides a light-emitting composition comprising a polymer and a phosphorescent light-emitting material wherein the polymer comprises conjugating repeat units of formula (I) and up to 20 mol % of conjugation-blocking repeat units of repeat units of formula (II):

wherein $Ar^1$ represents an aryl or heteroaryl group; $R^1$, which may be the same or different in each occurrence, is a substituent; p is 0 or a positive integer; $Ar^2$ in each occurrence independently represents a substituted or unsubstituted aryl or heteroaryl group; and $Sp^1$ represents an acyclic spacer group that does not provide any conjugation path between the two groups $Ar^2$.

Optionally, p is 0, 1, 2, 3 or 4. In one optional arrangement, p is at least 1 and each $R^1$ is a non-polar substituent. Optionally, each $R^1$ is selected from $C_{1-30}$ hydrocarbyl substituents.

In another optional arrangement, p is at least 1 and at least one $R^1$ is a polar substituent.

Optionally, p is at least 2 and each $R^1$ is a polar substituent.

Optionally, at least one substituent $R^1$ has formula (III):

wherein * represents a point of attachment of the substituent to $Ar^1$; $Sp^2$ is a spacer group; PG is a polar group; b is 0 or 1; and c is at least 1, optionally 1, 2 or 3.

Optionally, $Sp^2$ is a $C_{1-10}$ hydrocarbyl group, preferably unsubstituted phenyl or phenyl substituted with one or more $C_{1-10}$ alkyl groups.

Optionally, PG in each occurrence is a $C_{1-20}$ alkyl chain wherein one or more non-adjacent carbon atoms of the alkyl chain are replaced with oxygen atoms.

Optionally, $R^1$ in each occurrence has formula (III):

wherein m independently in each occurrence is at least 1, optionally 1, 2 or 3; p is at least 1, optionally 1, 2 or 3; and $R^4$ in each occurrence is independently H or a substituent, preferably H or $C_{1-5}$ alkyl.

Optionally, PG in each occurrence has formula (IIIa):

Optionally, the polymer further comprises a repeat unit of formula (XII):

wherein $Ar^3$ is an aryl or heteroaryl group; $R^2$ in each occurrence is independently a non-polar substituent; and q is 0 or an integer, preferably 1, 2 or 3.

Optionally, $R^2$ in each occurrence is a $C_{1-40}$ hydrocarbyl.

Optionally, $Ar^3$ is selected from fluorene and phenylene.

Optionally, $Ar^1$ is selected from fluorene and phenylene repeat units. Optionally, the fluorene repeat unit has formula (IV):

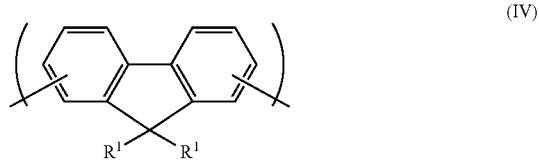

wherein $R^1$ is as described above.

Optionally, $Ar^2$ is substituted or unsubstituted aryl, optionally substituted or unsubstituted phenyl.

Optionally, $Sp^1$ is a $C_{1-20}$ alkyl group of which one or more non-adjacent C atoms may be replaced with O.

Optionally, $Sp^1$ has formula (XIIIa) or (XIIIb):

wherein $R^4$ is as described above; i is at least 1, optionally 1-5; and j is at least 1, optionally 1-10.

Optionally, the polymer comprises co-repeat units of formula (VII):

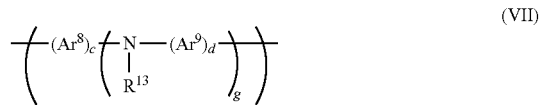

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent, c and d are each independently 1, 2 or 3, and any two of $Ar^8$, $Ar^9$ and $R^{13}$ directly bound to the same N atom may be linked by a single bond or divalent linking group.

Optionally, the polymer comprises unsubstituted or substituted arylene or heteroarylene co-repeat units wherein said co-repeat units are not substituted with polar substituents.

Optionally, the arylene or heteroarylene co-repeat units are selected from fluorene and phenylene co-repeat units, each of which may be unsubstituted or substituted with one or more $C_{1-30}$ hydrocarbyl substituents.

Optionally, the phosphorescent light-emitting material is a red light-emitting material.

Optionally, the phosphorescent light-emitting material is covalently bound to the polymer.

Optionally, the light-emitting composition is a white light-emitting composition.

Optionally, the polymer comprises up to 10 mol %, optionally up to 5 mol %, of repeat units of formula (II).

In a second aspect the invention provides a formulation comprising at least one solvent and the composition of the first aspect.

In a third aspect the invention provides a light-emitting device comprising an anode, a cathode and a light-emitting layer between the anode and the cathode, the light-emitting layer comprising a light-emitting composition according to the first aspect.

Optionally according to the third aspect, the device is a light-emitting electrochemical cell and the light-emitting layer comprises a salt and an electrolyte.

In a fourth aspect the invention provides a method of forming a light-emitting device according to the third aspect, the method comprising the step of forming a light-emitting layer comprising the composition according to the first aspect over one of the anode and cathode, and depositing the other of the anode and cathode over the light-emitting layer.

Optionally according to the fourth aspect, the light-emitting layer is formed by depositing a formulation according to the second aspect and evaporating the at least one solvent.

"Aryl" and "heteroaryl" as used herein includes both fused and unfused aromatic and heteroaromatic groups.

DESCRIPTION OF THE DRAWINGS

The invention will now be described in more detail with reference to the Figures, in which.

DETAILED DESCRIPTION OF THE INVENTION

Figure 1:
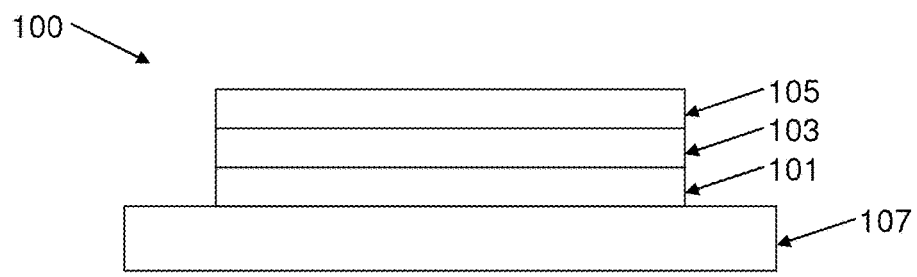
FIG. 1 illustrates an OLED according to an embodiment of the invention.

With reference to FIG. 1, an OLED or LEC 100 comprises an anode 101, a cathode 105 and a light-emitting layer 103 between the anode and cathode. The device 100 is supported on a substrate 107, for example a glass or plastic substrate.

In the case of an OLED, the light-emitting layer 103 contains at least a host polymer and one or more phosphorescent materials. In the case of a LEC, the light-emitting layer further contains a salt and a polymer electrolyte. The light-emitting layer 103 may consist essentially of these materials or may contain one or more further materials, for example one or more charge-transporting materials or one or more further light-emitting materials.

In the case of LECs, salts with relatively small anions or cations may be more mobile than salts with bulkier ions.

Preferred cations of the salt include alkali (e.g. lithium), alkali earth and ammonium cations. Ammonium cations include $NH_4^+$ cations and mono-, di-tri and tetraalkylammonium cations.

Preferred anions of the salt include halogen-containing anions, in particular fluorine-containing anions, for example hexafluorophosphate and tetrafluoroborate, and sulfonates.

The light-emitting composition may include only one salt or more than one salt. The ionic salt or salts may be provided in an amount in the range 0.1-10% by weight, optionally 1-10% by weight, of the composition. Exemplary salts include the following:

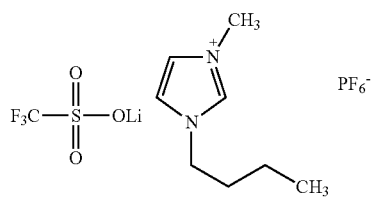

Exemplary polymer electrolytes include polyethylene oxide (PEO) and copolymers of ethylene oxide. Use of substituents of formula (III) as described above for repeat units of formula (I), such as oligoether substituents, may improve compatibility of the host polymer with the polymer electrolyte.

One or more further layers may be provided between the anode 101 and cathode 105. The device may contain more than one light-emitting layer.

In the case of a LEC, preferred device structures include:
Anode/Light-emitting layer/Cathode
Anode/Hole-injection layer/Light-emitting layer/Cathode
In the case of an OLED, preferred device structures include:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

For an OLED, at least one of a hole-transporting layer and hole injection layer is present. Preferably, both a hole injection layer and hole-transporting layer are present.

An OLED or LEC may contain a light-emitting layer containing a composition according to the invention as the only light-emitting layer, or more than one light-emitting layer may be present.

The device may contain more than one light-emitting material. Where more than one light-emitting material is present, all light-emitting materials may be provided by a composition of the invention, or the composition may contain one or more light-emitting materials with one or more further light-emitting materials provided in one or more further light-emitting layers of the device.

Light-emitting materials include red, green and blue light-emitting materials.

A blue emitting material may have a photoluminescent spectrum with a peak in the range of 400-490 nm, optionally 420-490 nm.

A green emitting material may have a photoluminescent spectrum with a peak in the range of more than 490 nm up to 580 nm, optionally more than 490 nm up to 540 nm.

A red emitting material may optionally have a peak in its photoluminescent spectrum of more than 580 nm up to 630 nm, optionally 585-625 nm.

In a preferred embodiment, the phosphorescent material of the composition is a red phosphorescent light-emitting material.

The polymer of the composition of the invention comprises conjugating repeat units of formula (I), and repeat units of formula (II) described above that do not provide any conjugation path between repeat units adjacent to the repeat units of formula (II).

"Conjugating repeat unit" as used herein means a repeat unit that provides a conjugation path between repeat units on either side of the conjugating repeat unit, unlike the non-conjugating repeat units of formula (II).

It is preferred that the triplet energy level of the polymer is no more than 0.1 eV below that of the phosphorescent material contained in the composition, and is preferably at least the same as or higher than the triplet energy level of the phosphorescent material.

The polymer may be a regular or random copolymer. Preferably, the polymer is a random copolymer.

Conjugating Repeat Units

Exemplary conjugating repeat units include arylene or heteroarylene repeat units, for example phenylene repeat units, fluorene repeat units and indenofluorene repeat units. Conjugating arylene or heteroarylene repeat units may be unsubstituted or substituted with one or more substituents.

The conjugating repeat units of the polymer may all be conjugating repeat units with at least one non-polar substituent and no polar substituents. The conjugating repeat units of the polymer may all have at least one polar substituent and no non-polar substituents. The polymer may contain conjugating repeat units with at least one polar substituent and one or more further conjugating repeat units that are unsubstituted or substituted with one or more non-polar groups. The polymer may contain conjugating repeat units with at least one polar substituent and at least one non-polar substituent.

Where present, the polar substituent or substituents of the repeat units of formula (I) may contain a polar group that is directly bound to the aromatic or heteroaromatic group $Ar^1$, or may contain one or more polar groups that are spaced from the aromatic or heteroaromatic group $Ar^1$ by a spacer group.

Polar substituents $R^1$ may contain one or more polar oligo-ether groups, for example substituents containing one or more polar groups —$(OCH_2CH_2)_p$—H wherein p is at least 1.

A preferred polar substituent $R^1$ is phenyl substituted with one or more polar groups, and optionally further substituted with one or more non-polar groups, for example one or more $C_{1-10}$ alkyl groups.

In the case of a LEC, substituents such as oligoether substituents may improve miscibility of host polymers with polymer electrolytes used for mobile ions of the LEC.

Non-polar substituents $R^1$ include $C_{1-40}$ hydrocarbyl groups, for example $C_{1-20}$ alkyl; unsubstituted phenyl; phenyl substituted with one or more $C_{1-20}$ alkyl groups; and a branched or linear chain of phenyl groups wherein each phenyl is unsubstituted or substituted with one or more $C_{1-20}$ alkyl groups.

Exemplary conjugating fluorene repeat units have formula (IV):

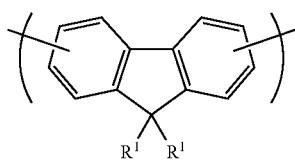

(IV)

wherein $R^1$, which may be the same or different in each occurrence, is a substituent and the two groups $R^1$ may be linked to form a ring.

Each $R^1$ may be a non-polar substituent.

Each $R^1$ may be a polar substituent.

One $R^1$ may be a polar substituent and the other $R^1$ may be a non-polar substituent.

In the case where $R^1$ is not a polar substituent, it may be $C_{1-40}$ hydrocarbyl, for example $C_{1-20}$ alkyl; unsubstituted phenyl; phenyl substituted with one or more $C_{1-20}$ alkyl groups; and a branched or linear chain of phenyl groups wherein each phenyl is unsubstituted or substituted with one or more $C_{1-20}$ alkyl groups.

Exemplary conjugating phenylene repeat units have formula (V):

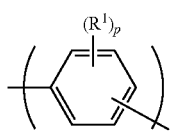

(V)

wherein p is 0, 1, 2, 3 or 4; and $R^1$ is a substituent as described with reference to formula (IV). In the case where p is 1, 2, 3 or 4, the or each substituent $R^1$ may independently be a non-polar substituent; the or each substituent $R^1$ may be a polar substituent; or in the case where p is 2, 3 or 4 the substituents $R^1$ may include both polar and non-polar substituents. Non-polar substituents $R^1$ of formula (V) are preferably selected from $C_{1-20}$ alkyl.

Another exemplary conjugating arylene repeat unit has formula (VI):

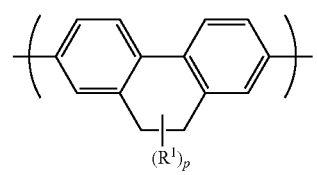

(VI)

wherein $R^1$ and p are as described with reference to formulae (IV) and (V).

Further arylene repeat units include: indenofluorene repeat units; phenanthrene repeat units; naphthalene repeat units; anthracene repeat units; and perylene repeat units. Each of these arylene repeat units may be linked to adjacent repeat units through any two of the aromatic carbon atoms of these units. Specific exemplary linkages include 9,10-anthracene; 2,6-anthracene; 1,4-naphthalene; 2,6-naphthalene; 2,7-phenanthrene; and 2,5-perylene. Each of these repeat units may be unsubstituted or substituted with one or more substituents $R^1$.

Specific exemplary repeat units of formula (I) substituted with polar groups include the following:

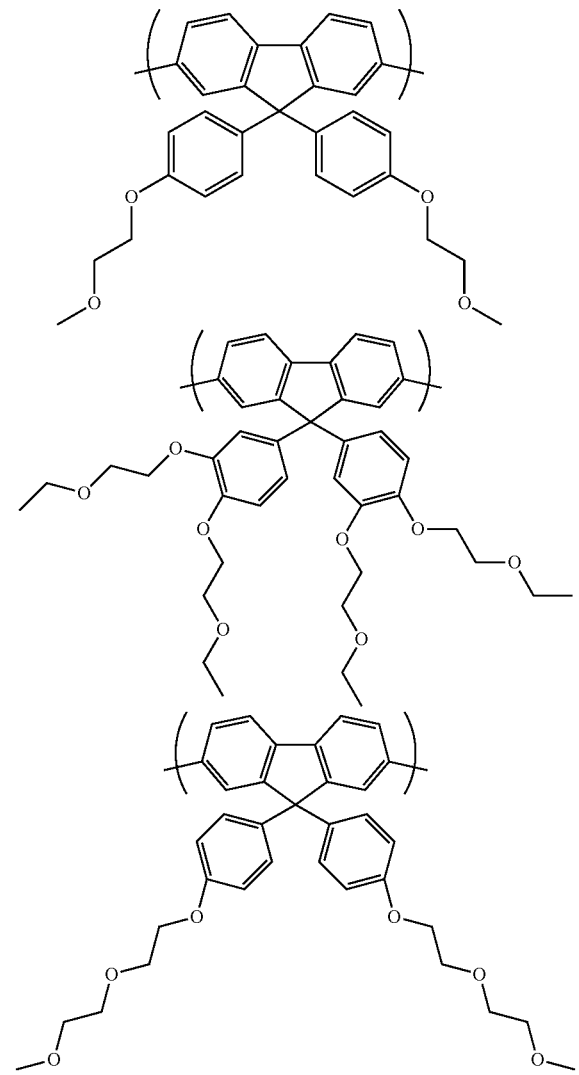

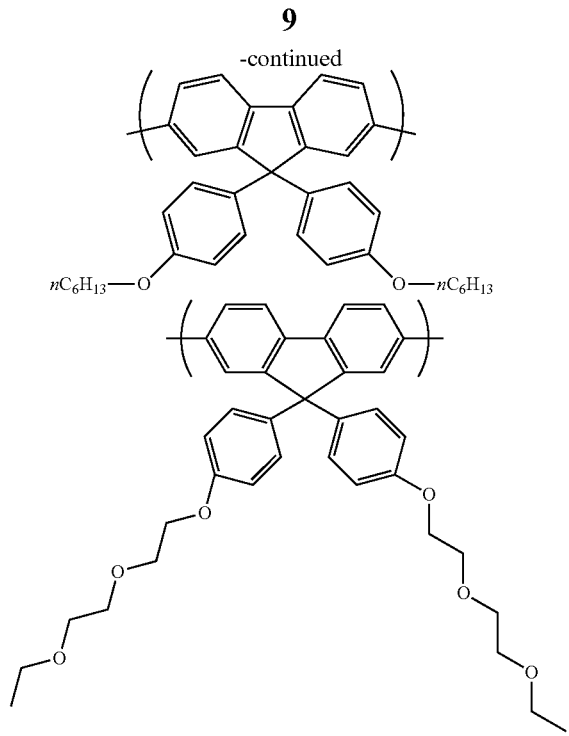

The polar substituents may have poly-disperse sidechains. For example, the polar substituents may have polydisperse polyether sidechains of formula (III) or (IIIa). An exemplary repeat unit having polydisperse side-chains has the following formula:

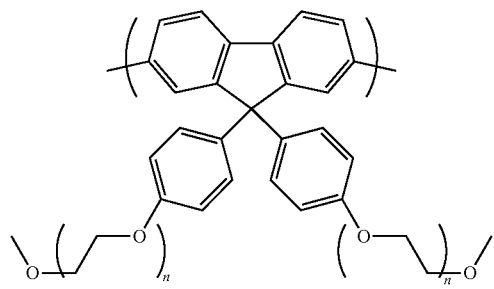

wherein n in each occurrence is at least 1.

Specific exemplary repeat units of formula (I) substituted with non-polar groups include repeat units in which $R^1$ is selected from $C_{1-20}$ alkyl, phenyl, and phenyl substituted with one or more $C_{1-20}$ alkyl groups, for example:

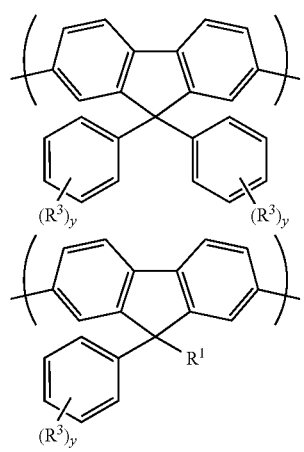

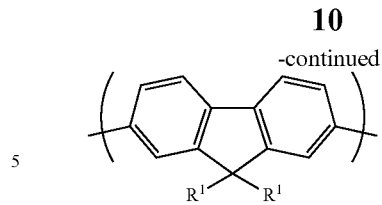

wherein $R^1$ and $R^3$ in each occurrence are independently a $C_{1-20}$ alkyl and y is 0 or 1-5, preferably 0, 1, 2 or 3.

The polymer may include repeat units of formula (I) wherein at least one $R^1$ is a polar substituent, repeat units of formula (II) and repeat units of formula (XII):

(XII)

wherein $Ar^a$ in each occurrence is an aryl or heteroaryl group; $R^2$ in each occurrence is independently a non-polar substituent; and q is 0 or an integer, preferably 1, 2 or 3.

Exemplary repeat units of formula (XII) include repeat units (XIIa), (XIIb) and (XIIc):

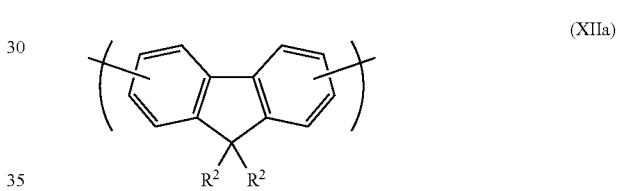
(XIIa)

(XIIb)

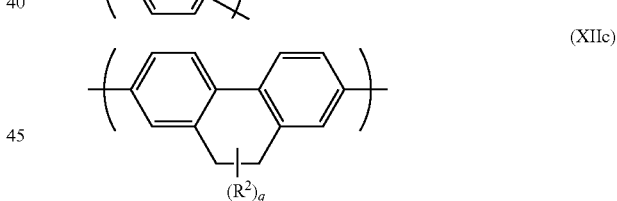
(XIIc)

wherein $R^3$ in each occurrence is H or a non-polar substituent, and wherein two $R^3$ groups bound to the same or adjacent carbon atoms may be linked to form a ring.

Exemplary non-polar substituents $R^2$ include $C_{1-40}$ hydrocarbyl groups, for example $C_{1-20}$ alkyl; unsubstituted phenyl; phenyl substituted with one or more $C_{1-20}$ alkyl groups; and a branched or linear chain of phenyl groups wherein each phenyl is unsubstituted or substituted with one or more $C_{1-20}$ alkyl groups.

Preferably, the polymer comprises at least 40 mol % or at least 50 mol %, preferably at least 60 mol %, of conjugating aromatic repeat units, including repeat units of formula (I) and, where present, repeat units of formula (XII).

The polymer may contain conjugating repeat units of formula (I) having two or more different conjugating repeat units. For example, the polymer may contain phenylene repeat units and fluorene repeat units.

The extent of conjugation provided by a conjugating repeat unit (including repeat units that are substituted with one or more polar substituents and conjugating repeat units that are not so substituted) may depend on the positions through which that conjugating repeat unit is linked to the adjacent repeat units, and may depend on location and nature of substituents on the conjugating repeat unit.

For example, a high degree of conjugation may be provided by 1,4-linked phenylene repeat units, as illustrated by a chain of phenylene repeat units A-B-C wherein unit B provides a conjugation path between adjacent repeat units A and C on either side of unit B:

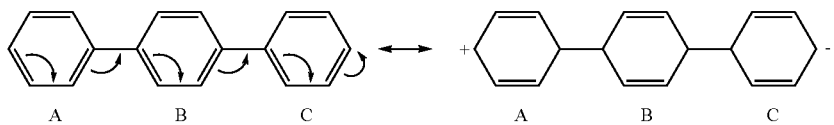

Likewise, a high degree of conjugation may be provided by 2,7-linked fluorene repeat units and 2,8-linked indenofluorene repeat units.

A lower degree of conjugation may be provided by 1,2- or 1,3-linked phenylene repeat units and 3- and/or 6-linked fluorene repeat units.

The nature and location of substituents may affect the degree of conjugation of a conjugating repeat unit. A substituent located adjacent to a linking position of a repeat unit may create steric hindrance with an adjacent repeat unit, causing a twist between the two repeat units and reducing the extent of pi orbital overlap between the two repeat units as compared to the case where that substituent is absent.

Exemplary substituents for creating steric hindrance between adjacent repeat units are $C_{1-30}$ hydrocarbyl groups, for example $C_{1-20}$ alkyl groups and $C_{1-30}$ arylalkyl groups.

Preferred conjugating repeat units that provide a limited degree of conjugation between repeat units adjacent to the conjugating repeat units are phenylene repeat units of formula (V) wherein at least one of p and q is at least 1, in particular a 2,5-substituted repeat unit of formula (V).

Non-Conjugating Repeat Units

With reference to formula (II), $Sp^1$ may contain a single non-conjugating atom only between the two groups $Ar^2$, or $Sp^1$ may contain non-conjugating chain of at least 2 atoms separating the two groups $Ar^2$.

A non-conjugating atom may be, for example, —O—, —S—, —$CR^4_2$- or —$SiR^4_2$— wherein $R^4$ in each occurrence is H or a substituent, optionally $C_{1-20}$ alkyl.

A spacer chain $Sp^1$ may contain two or more atoms separating the two groups $Ar^2$, for example a $C_{1-20}$ alkyl chain wherein one or more non-adjacent C atoms of the chain may be replaced with O or S. Preferably, the spacer chain $Sp^1$ contains at least one $sp^3$-hybridised carbon atom separating the two groups $Ar^2$.

Preferred groups $Sp^1$ are selected from $C_{1-20}$ alkyl wherein one or more non-adjacent C atoms are replaced with O. An oligo-ether chain, for example a chain of formula —$O(CH_2CH_2O)_n$— may be provided, wherein n is from 1-5.

Preferred groups $Ar^2$ include phenyl, each of which may independently be unsubstituted or substituted. Exemplary substituents are $C_{1-20}$ alkyl.

The non-conjugating repeat units of formula (II) of the polymer may all have the same structure, or the polymer may contain two or more different non-conjugating repeat unit structures of formula (II).

Exemplary non-conjugating repeat units include the following:

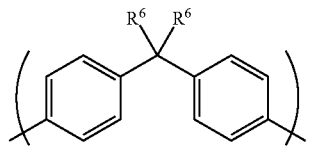

-continued

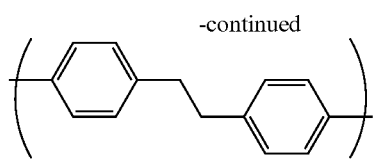

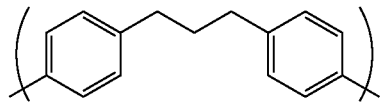

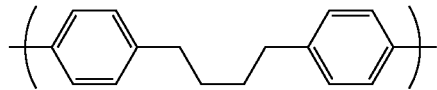

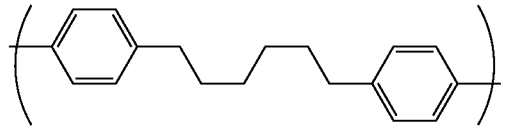

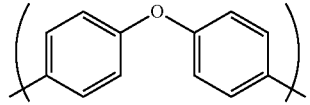

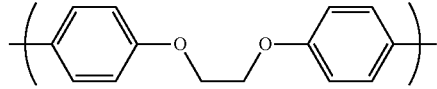

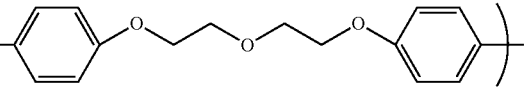

wherein $R^6$ in each occurrence is independently H or a substituent, optionally H or $C_{1-20}$ alkyl.

Non conjugating repeat units may make up to 20 mol % of the repeat units of the polymer, optionally up to 10 mol % or up to 5 mol %. Non-conjugating repeat units may make up at least 1 mol % of the repeat units of the polymer.

Further Repeat Units

Further co-repeat units that may be present in the host polymer include repeat units of formula (VII):

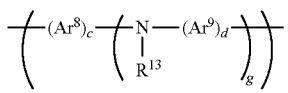
(VII)

wherein Ar⁸ and Ar⁹ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3.

$R^{13}$, which may be the same or different in each occurrence when g>1, is preferably selected from the group consisting of alkyl, for example $C_{1-20}$ alkyl, $Ar^{10}$, a branched or linear chain of $Ar^{10}$ groups, or a crosslinkable unit that is bound directly to the N atom of formula (VIII) or spaced apart therefrom by a spacer group, wherein $Ar^{10}$ in each occurrence is independently optionally substituted aryl or heteroaryl. Exemplary spacer groups are $C_{1-20}$ alkyl, phenyl and phenyl-$C_{1-20}$ alkyl.

Any of Ar⁸, Ar⁹ and, if present, $Ar^{10}$ in the repeat unit of Formula (IX) may be linked by a direct bond or a divalent linking atom or group to another of Ar⁸, Ar⁹ and $Ar^{10}$. Preferred divalent linking atoms and groups include O, S; substituted N; and substituted C.

Any of Ar⁸, Ar⁹ and, if present, $Ar^{10}$ may be substituted with one or more substituents. Exemplary substituents are substituents $R^5$, wherein each $R^5$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group attached directly to the fluorene unit or spaced apart therefrom by a spacer group, for example a group comprising a double bond such and a vinyl or acrylate group, or a benzocyclobutane group Preferred repeat units of formula (VII) have formulae 1-3:

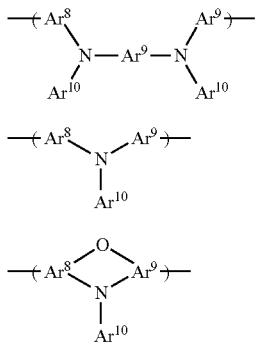

In one preferred arrangement, $R^{13}$ is $Ar^{10}$ and each of Ar⁸, Ar⁹ and $Ar^{10}$ are independently and optionally substituted with one or more $C_{1-20}$ alkyl groups. Ar⁸, Ar⁹ and $Ar^{10}$ are preferably phenyl.

In another preferred arrangement, Ar⁸ and Ar⁹ are phenyl, each of which may be substituted with one or more $C_{1-20}$ alkyl groups, and $R^{13}$ is —$(Ar^{10})_r$ wherein r is at least 2 and wherein the group —$(Ar^{10})_r$ forms a linear or branched chain of aromatic or heteroaromatic groups, for example 3,5-diphenylbenzene wherein each phenyl may be substituted with one or more $C_{1-20}$ alkyl groups.

In another preferred arrangement, c, d and g are each 1 and Ar⁸ and Ar⁹ are phenyl linked by an oxygen atom to form a phenoxazine ring.

Amine repeat units may be provided in a molar amount in the range of about 0.5 mol % up to about 50 mol %, optionally about 1-25 mol %, optionally about 1-10 mol %.

The polymer may contain one, two or more different repeat units of formula (VII).

Amine repeat units may provide hole-transporting and/or light-emitting functionality. Preferred light-emitting amine repeat units include a blue light-emitting repeat unit of formula (VIIa) and a green light-emitting repeat unit formula (VIIb):

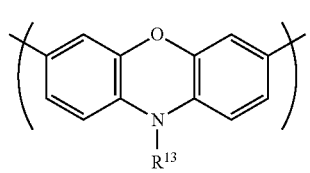
(VIIa)

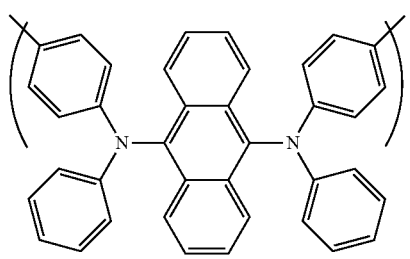
(VIIIb)

$R^{13}$ of formula (VIIa) is preferably a hydrocarbyl, preferably $C_{1-20}$ alkyl, phenyl that is unsubstituted or substituted with one or more $C_{1-20}$ alkyl groups, or a branched or linear chain of phenyl groups wherein each said phenyl group is unsubstituted or substituted with one or more $C_{1-20}$ alkyl groups.

The repeat unit of formula (VIIIb) may be unsubstituted or one or more of the rings of the repeat unit of formula (VIIIb) may be substituted with one or more substituents $R^{15}$, preferably one or more $C_{1-20}$ alkyl groups.

The polymer may contain repeat units of formula (VIII):

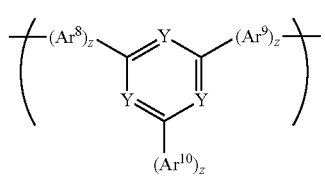
(VIII)

wherein Ar⁸, Ar⁹ and $Ar^{10}$ are as described with reference to formula (VII) above, and may each independently be substituted with one or more substituents described with reference to Ar⁸, Ar⁹ and $Ar^{10}$, and z in each occurrence is independently at least 1, optionally 1, 2 or 3, preferably 1, and Y is N or $CR^{14}$, wherein $R^{14}$ is H or a substituent, preferably H or $C_{1-10}$ alkyl. Preferably, Ar⁸, Ar⁹ and $Ar^{10}$ of formula (VIII) are each phenyl, each phenyl being optionally and independently substituted with one or more $C_{1-20}$ alkyl groups.

In one preferred embodiment, all 3 groups Y are N.

If all 3 groups Y are CR$^{14}$ then at least one of Ar$^8$, Ar$^9$ and Ar$^{10}$ is preferably a heteroaromatic group comprising N.

Each of Ar$^8$, Ar$^9$ and Ar$^{10}$ may independently be substituted with one or more substituents. In one arrangement, Ar$^8$, Ar$^9$ and Ar$^{10}$ are phenyl in each occurrence. Exemplary substituents include R$^5$ as described above with reference to formula (V), for example C$_{1-20}$ alkyl or alkoxy.

Ar$^{10}$ of formula (VIII) is preferably phenyl, and is optionally substituted with one or more C$_{1-20}$ alkyl groups or a crosslinkable unit.

Preferably, z is 1 and each of Ar$^8$, Ar$^9$ and Ar$^{10}$ is unsubstituted phenyl or phenyl substituted with one or more C$_{1-20}$ alkyl groups.

A particularly preferred repeat unit of formula (VIII) has formula (VIIIa), which may be unsubstituted or substituted with one or more substituents R$^5$, preferably one or more C$_{1-20}$ alkyl groups:

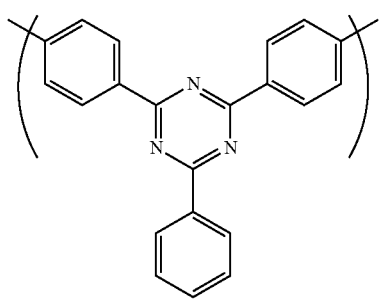

(VIIIa)

The polymeric repeat units of a given formula as described herein may all be the same or may be different. For example, the polymer may contain fluorene repeat units of formula (I) and phenylene repeat units of formula (I).

Phosphorescent Light-Emitting Materials

Exemplary phosphorescent light-emitting materials include metal complexes comprising substituted or unsubstituted complexes of formula (IX):

$$ML^1{}_q L^2{}_r L^3{}_s \quad (IX)$$

wherein M is a metal; each of L$^1$, L$^2$ and L$^3$ is a coordinating group; q is an integer; r and s are each independently 0 or an integer; and the sum of (a·q)+(b·r)+(c·s) is equal to the number of coordination sites available on M, wherein a is the number of coordination sites on L$^1$, b is the number of coordination sites on L$^2$ and c is the number of coordination sites on L$^3$.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands L$^1$, L$^2$ and L$^3$ include carbon or nitrogen donors such as porphyrin or bidentate ligands of formula (X):

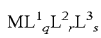

(X)

wherein Ar$^5$ and Ar$^6$ may be the same or different and are independently selected from substituted or unsubstituted aryl or heteroaryl; X$^1$ and Y$^1$ may be the same or different and are independently selected from carbon or nitrogen; and Ar$^5$ and Ar$^6$ may be fused together. Ligands wherein X$^1$ is carbon and Y$^1$ is nitrogen are preferred, in particular ligands in which Ar$^5$ is a single ring or fused heteroaromatic of N and C atoms only, for example pyridyl or isoquinoline, and Ar$^6$ is a single ring or fused aromatic, for example phenyl or naphthyl.

Examples of bidentate ligands are illustrated below:

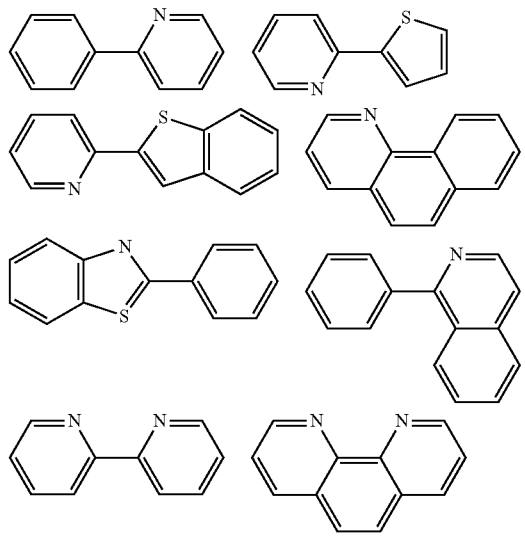

Each of Ar$^5$ and Ar$^6$ may carry one or more substituents. Two or more of these substituents may be linked to form a ring, for example an aromatic ring.

Other ligands suitable for use with d-block elements include diketonates, in particular acetylacetonate (acac); triarylphosphines and pyridine, each of which may be substituted.

Exemplary substituents include groups R$^{13}$ as described above with reference to Formula (VII). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example C$_{1-20}$ alkyl or alkoxy, which may be as disclosed in JP 2002-324679; carbazole which may be used to assist hole transport to the complex when used as an emissive material, for example as disclosed in WO 02/81448; bromine, chlorine or iodine which can serve to functionalise the ligand for attachment of further groups, for example as disclosed in WO 02/68435 and EP 1245659; and dendrons which may be used to obtain or enhance solution processability of the metal complex, for example as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

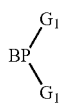

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

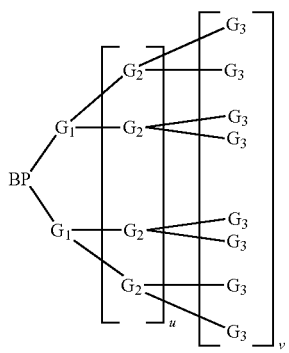

(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ . . . $G_n$ is phenyl, and each phenyl BP, $G_1$, $G_2$ . . . $G_{n-1}$ is a 3,5-linked phenyl.

A preferred dendron is a substituted or unsubstituted dendron of formula (XIb):

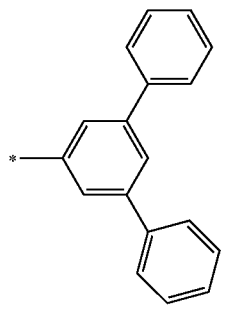

(XIb)

wherein * represents an attachment point of the dendron to a core.

BP and/or any group G may be substituted with one or more substituents, for example one or more $C_{1-20}$ alkyl or alkoxy groups.

Phosphorescent light-emitting materials may be present in an amount of about 0.05 mol % up to about 20 mol %, optionally about 0.1-10 mol % relative to the host polymer.

The phosphorescent light-emitting material of the inventive composition may be physically mixed with the host polymer comprising repeat units of formulae (I) and (II) or bound thereto, for example in a side-chain, main chain or end-group of the polymer. Where the phosphorescent material is provided in a polymer side-chain, the phosphorescent material may be directly bound to the backbone of the polymer or spaced apart therefrom by a spacer group, for example a $C_{1-20}$ alkyl spacer group in which one or more non-adjacent C atoms may be replaced by O or S. It will therefore be appreciated that the composition of the present invention may consist of or may comprise a polymer with a phosphorescent light-emitting material bound to the polymer.

In a preferred embodiment, the phosphorescent light-emitting material is a red light-emitting material An example of a red phosphorescent light-emitting material is fac-tris(1-phenylisoquinoline)iridium (III), which may be substituted with one or more substituents, for example as described above with reference to Formula (IX). The composition of the invention may contain more than one phosphorescent light-emitting material. Each phosphorescent light-emitting material may be selected from compounds of formula (IX) described above.

Polymer Synthesis

Preferred methods for preparation of conjugated polymers, such as homopolymer or copolymer comprising repeat units of formula (I) and (II) as described above, comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable pi-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end-capping group or side group carrying only one reactive leaving group may be bound to the polymer by reaction of a leaving group at the polymer chain end or side respectively.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular copolymers may be prepared when both reactive groups of a first monomer are boron and both reactive groups of a second monomer are halogen.

As alternatives to halides, other leaving groups capable of participating in metal insertion include sulfonic acids and sulfonic acid esters such as tosylate, mesylate and triflate.

Light-Emitting Layers

The light-emitting layer or layers of an OLED or LEC may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

White Light Emission

A white-emitting OLED or LEC may contain a single, white-emitting layer or may contain two or more layers that emit different colours which, in combination, produce white light. The light emitted from a white-emitting OLED or LEC may have CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-4500K.

Combinations of light-emitting materials that may provide white light include:
 phosphorescent red, green and blue
 fluorescent blue, phosphorescent green and phosphorescent red
 fluorescent blue, fluorescent green and phosphorescent red The inventive composition may form a single layer of an OLED or LEC that contains all of the light-emitting materials required to obtain blue light, or the materials producing white light may be distributed among the layer containing the inventive composition and one or more further light-emitting layers.

One or more light-emitting materials may be provided as components of the polymer comprising repeat units of formulae (I) and (II). In a preferred embodiment, the polymer comprises fluorescent blue emitting repeat units; fluorescent green emitting repeat units; and the phosphorescent light-emitting material is a red phosphorescent material provided as a repeat unit, side group or end group of the polymer.

If the inventive composition contains one or more light-emitting materials having a lower triplet energy than the phosphorescent light-emitting material, for example a green fluorescent material, then the concentration of the lower triplet energy material may be relatively low in order to avoid quenching of light emitted from the phosphorescent light-emitting material, optionally in an amount of 0.01-0.2 mol %.

Charge Transporting and Charge Blocking Layers

In the case of an OLED, a hole transporting layer may be provided between the anode and the light-emitting layer or layers. Likewise, an electron transporting layer may be provided between the cathode and the light-emitting layer or layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A charge-transporting layer or charge-blocking layer may be crosslinked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group.

If present, a hole transporting layer located between the anode and the light-emitting layers preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers.

If present, an electron transporting layer located between the light-emitting layers and cathode preferably has a LUMO level of around 3-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

A hole transporting layer may contain a homopolymer or copolymer comprising a repeat unit of formula (VII) as described above, for example a copolymer comprising one or more amine repeat units of formula (VII) and one or more arylene repeat units, for example one or more arylene repeat units selected from formulae (IV), (V) and (VI).

An electron transporting layer may contain a polymer comprising a chain of optionally substituted arylene repeat units, such as a chain of fluorene repeat units.

If a hole- or electron-transporting layer is adjacent a light-emitting layer containing a phosphorescent material then the $T_1$ energy level of the material or materials of that layer are preferably higher than that of the phosphorescent emitter in the adjacent light-emitting layer.

Hole Injection Layers

A conductive hole injection layer, which may be formed from a conductive organic or inorganic material, may be provided between the anode 101 and the light-emitting layer 103 of an OLED or LEC as illustrated in FIG. 1 to assist hole injection from the anode into the layer or layers of semiconducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode 105 is selected from materials that have a workfunction allowing injection of electrons into the light-emitting layer of the OLED or LEC. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low workfunction material and a high workfunction material such as calcium and aluminium, for example as disclosed in WO 98/10621. The cathode may comprise elemental barium, for example as disclosed in WO 98/57381, Appl. Phys. Lett. 2002, 81(4), 634 and WO 02/84759. The cathode may comprise a thin layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming a light-emitting layer may be formed by mixing the components of the composition with one or more suitable solvents.

The formulation may be a solution of the composition in the one or more solvents, or may be a dispersion of the composition in the one or more solvents in which one or more components are not dissolved. Preferably, the formulation is a solution.

In the case of a LEC, more than one solvent may be used if the host polymer and/or phosphorescent material or materials of the composition are soluble in at least one of the solvents and if the polymer electrolyte is soluble in at least one of the other solvents.

Solvents suitable for dissolving semiconducting polymers, particularly polymers comprising alkyl substituents, include benzenes substituted with one or more $C_{1-10}$ alkyl or $C_{1-10}$ alkoxy groups, for example toluene, xylenes and methylanisoles.

Particularly preferred solution deposition techniques including printing and coating techniques such spin-coating and inkjet printing.

Spin-coating is particularly suitable for devices wherein patterning of the light-emitting layer is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

EXAMPLES

Synthesis of Conjugation Breaking Monomer 1

Conjugation Breaking Monomer 1 was prepared according to the following reaction scheme:

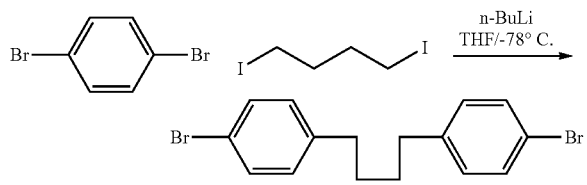

Conjugation Breaking Monomer 1

To a stirred solution of 1,4-dibromobenzene (506.7 g, 2.15 mol) in tetrahydrofuran (3 L) was added dropwise a solution of n-butyllithium (2.5 M in hexane) at −78° C. under nitrogen. The resulting mixture was allowed to warm to room temperature overnight and quenched with water (300 mL). The crude reaction mixture was concentrated in vacuo to give a residue that was taken up in diethyl ether/water (3:1, 400 mL). The aqueous layer was extracted with diethyl ether (3×100) and the combined organic extracts was washed with brine, dried (MgSO$_4$) and concentrated in vacuo to give oil that solidified to give a yellow crystals overnight. The solid was triturated with methanol (200 mL) overnight, filtered and dried under vacuum. The solid was purified further by vacuum sublimation (140° C., 10$^{-3}$ mbar) to give the product as a white solid (98% pure by GCMS, 65 g).

Synthesis of Conjugation Breaking Monomer 2

A monomer for forming a conjugation breaking repeat unit was prepared according to the following reaction scheme:

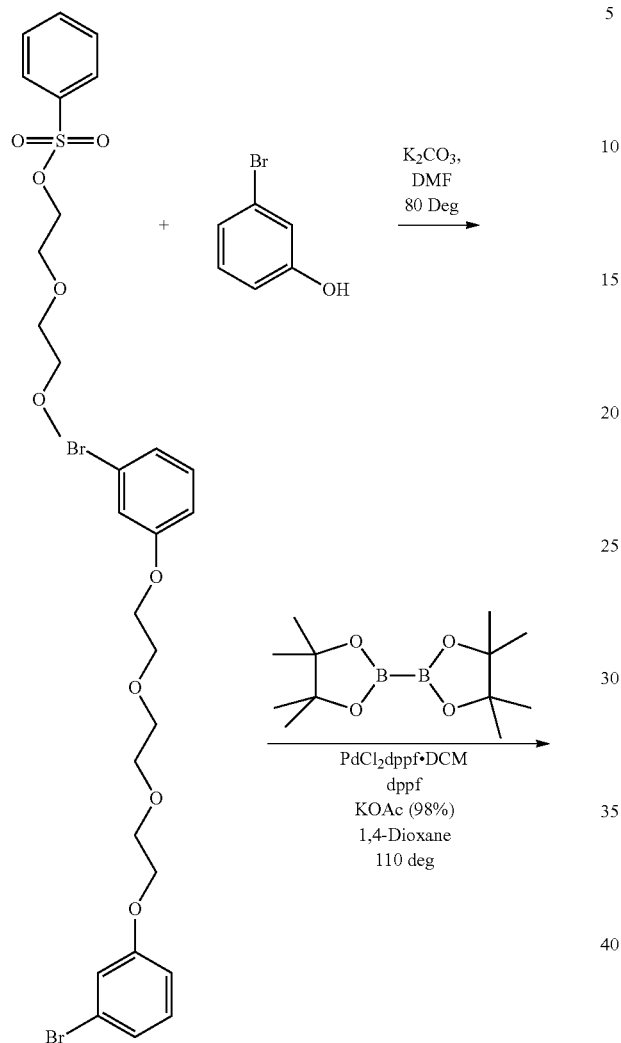

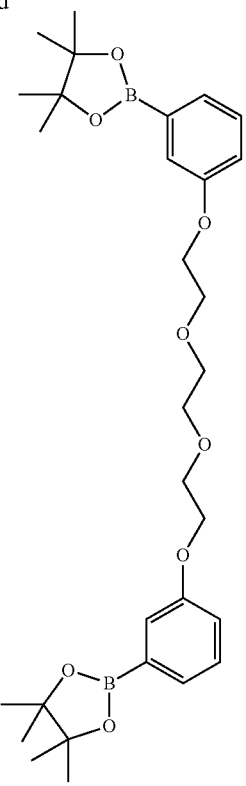

Polymer Synthesis

Polymers were prepared by Suzuki polymerization of monomers shown in Table 1, by the method described in WO 00/53656. Properties of the polymers are provided in Tables 2 and 3.

TABLE 1

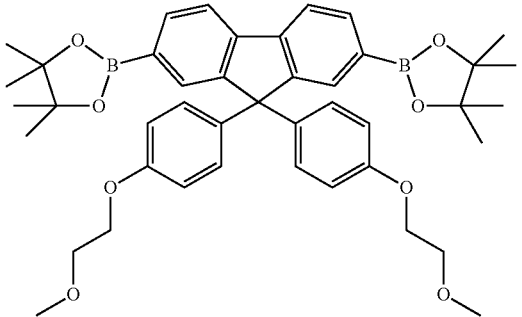

| Polymer Monomer | Comparative Polymer 1 | 1 | 2 | 3 | 4 | 5 |
|---|---|---|---|---|---|---|
| | 20 | 20 | 0 | 20 | 20 | 20 |

(mol %)

TABLE 1-continued
| Polymer Monomer | Comparative Polymer 1 | 1 | 2 | 3 | 4 | 5 |
|---|---|---|---|---|---|---|
| 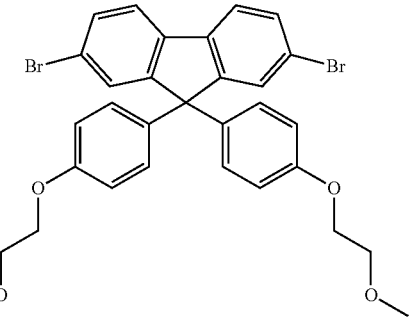 (mol %) | 19.9 | 19.9 | 19.9 | 19.9 | 19.95 | 19.9 |
| 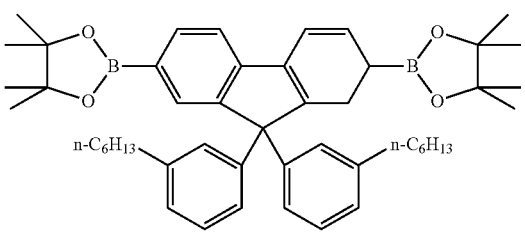 (mol %) | 30 | 20 | 30 | 25 | 25 | 25 |
| 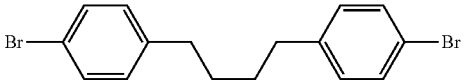 Conjugation breaker 1 (mol %) | 0 | 10 | 20 | 5 | 5 | 0 |
| 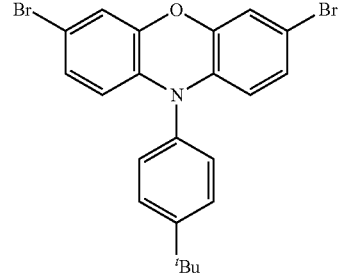 Fluorescent blue light-emitting unit (mol %) | 30 | 30 | 30 | 30 | 30 | 30 |
| 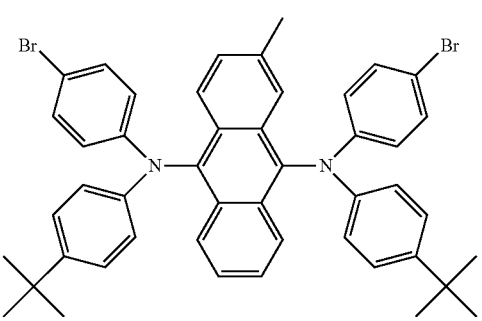 Fluorescent green light-emitting unit (mol %) | 0.05 | 0.05 | 0.05 | 0.05 | 0 | 0.05 |

TABLE 1-continued

| Polymer Monomer | Comparative Polymer 1 | 1 | 2 | 3 | 4 | 5 |
|---|---|---|---|---|---|---|
| Phosphorescent red light-emitting unit (mol %) | 0.05 | 0.05 | 0.05 | 0.05 | 0.05 | 0.05 |
| Conjugation breaker 2 (mol %) | 0 | 0 | 0 | 0 | 0 | 5 |

TABLE 2

| Polymer | Mz | Mw | Mp | Mn | PD |
|---|---|---|---|---|---|
| Comparative Polymer 1 | 453,000 | 259,000 | 234,000 | 79,700 | 3.26 |
| Polymer Example 1 | 659,000 | 364,000 | 329,000 | 78,000 | 4.71 |
| Polymer Example 2 | 599,000 | 315,000 | 234,000 | 44,700 | 7.05 |
| Polymer Example 3 | 563,000 | 309,000 | 273,000 | 74,000 | 4.16 |
| Polymer Example 4 | 395,000 | 228,000 | 209,000 | 65,000 | 3.49 |
| Polymer Example 5 | 448,000 | 247,000 | 221,000 | 66,200 | 3.74 |

TABLE 3

| Polymer | PLQY % | CIE X | CIE Y | HOMO | LUMO |
|---|---|---|---|---|---|
| Comparative Polymer 1 | 39.0 | 0.251 | 0.450 | 5.12 | 2.28 |
| Polymer Example 1 | 60.0 | 0.280 | 0.444 | 5.11 | 2.26 |
| Polymer Example 2 | 66.5 | 0.290 | 0.419 | 5.13 | 2.18 |
| Polymer Example 3 | 59.3 | 0.269 | 0.452 | 5.12 | 2.27 |
| Polymer Example 4 | 57.3 | 0.261 | 0.389 | 5.12 | 2.27 |
| Polymer Example 5 | 51.7 | 0.264 | 0.449 | 5.12 | 2.27 |

PLQY error is +/−4.5% efficiency, CIEX/Y error is +/−0.01

HOMO and LUMO values were measured by cyclic voltammetry (CV) wherein the working electrode potential was ramped linearly versus time.

When cyclic voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinium counter electrode (donor or acceptor of electrons) and a reference glass electrode no leak Ag/AgCl. Ferrocene is added in the cell at the end of the experiment for calculation purposes. (Measurement of the difference of potential between Ag/AgCl/ferrocene and sample/ferrocene).

Method and settings:
3 mm diameter glassy carbon working electrode
Ag/AgCl/no leak reference electrode
Pt wire auxiliary electrode
0.1 M tetrabutylammonium hexafluorophosphate in acetonitrile
LUMO=4.8−ferrocene (peak to peak maximum average)+ onset
Sample: 1 drop of 5 mg/mL in toluene spun @3000 rpm
LUMO (reduction) measurement:
  A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline.

With reference to Table 2, it can be seen that there is little or no change in HOMO or LUMO values at up to 5 or 10 mol % incorporation of conjugation-breaking repeat units. Some change is observed at 20 mol %.

Without wishing to be bound by any theory, it is believed that HOMO and LUMO levels depend in part on the extent of conjugation of the aromatic repeat units of the polymer, and that incorporation of a relatively small amount of conjugation-breaking repeat units will not have a significant effect on the chain length of the longest conjugated chains of conjugating aromatic repeat units within the polymer.

With reference to Table 3, it has surprisingly been found that photoluminescent quantum yield (PLQY) is higher for all example polymers than for Comparative Polymer 1, which does not contain a conjugation-breaking repeat unit of formula (II), even though there is little or no change in HOMO or LUMO levels for the example polymers as compared to Comparative Polymer 1. Taking into account the margin of error, efficiency is similar for all materials from 5% incorporation up to 20 mol % incorporation of a conjugation-blocking repeat unit.

With reference to Polymer Example 4 the high efficiency of this polymer, which does contain a conjugation-breaking repeat unit but does not contain a green fluorescent material, indicates that high efficiency is due to the presence of the conjugation breaking repeat unit rather than conjugative isolation of the red phosphorescent emitter from the green fluorescent emitter.

Comparative Device 1

An organic light-emitting device having the following structure was prepared:

ITO/HIL/HTL/LE/Cathode wherein ITO is an indium-tin oxide anode; HIL is a hole-injecting layer formed by spin-coating an aqueous formulation of a hole-injection material available from Plextronics, Inc., HTL is a hole-transporting layer of about 20 nm thickness formed by spin-coating and crosslinking a hole transporting polymer, LE is a light-emitting layer formed by spin-coating Comparative Polymer 1; and the cathode was formed by evaporation of a first layer of a metal fluoride to a thickness of about 2 nm, a second layer of aluminium to a thickness of about 200 nm and an optional third layer of silver.

The hole transporting polymer was formed by Suzuki polymerization of the following monomers as described in WO 00/53656:

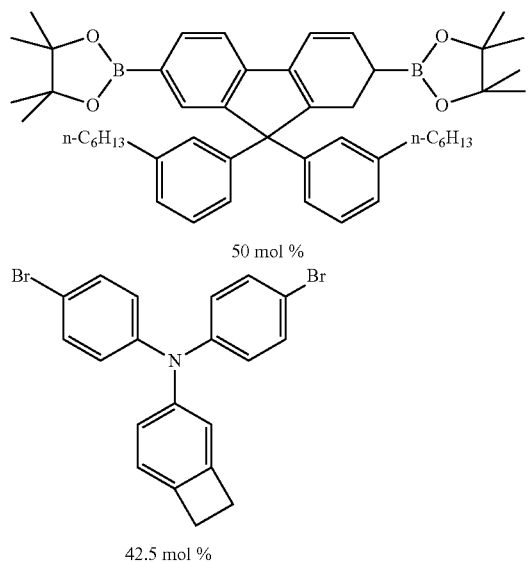

-continued

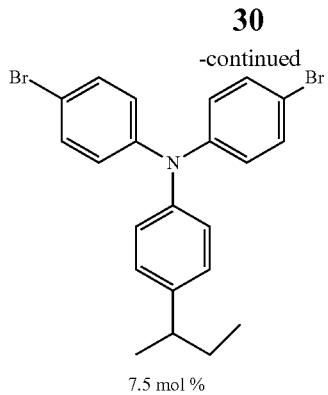

7.5 mol %

Device Examples 1-5

OLEDs were prepared as described with respect to Comparative Device 1, except that Polymer Examples 1-5 were used in place of Comparative Polymer 1 to give Device Examples 1-5 respectively.

Figure 2:
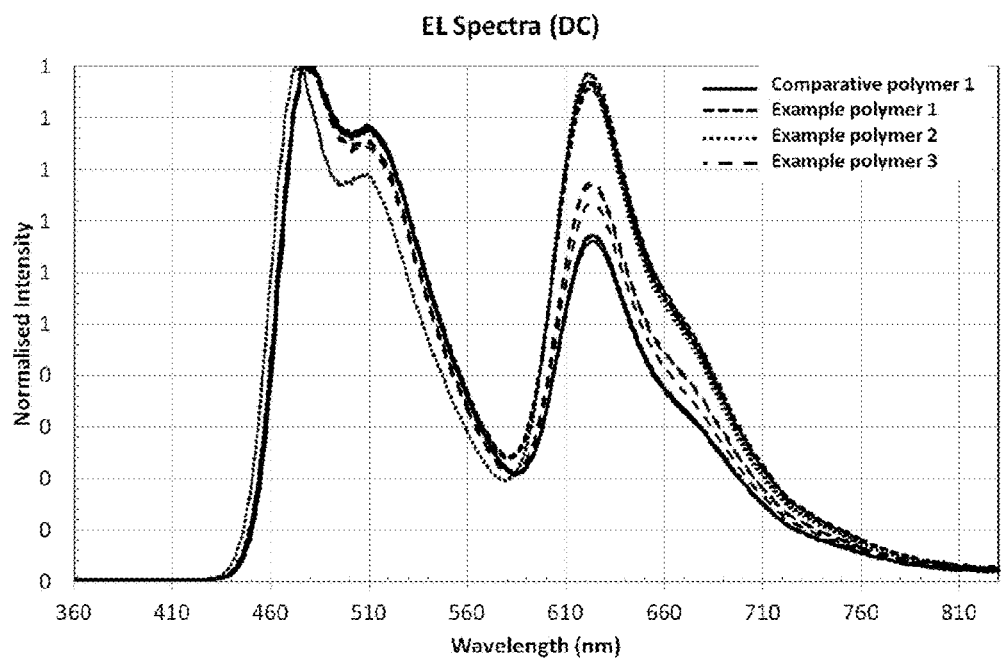
FIG. 2 shows the electroluminescent spectra of devices according to embodiments of the invention and a comparative device.

With reference to the electroluminescent spectra of FIG. 2, it can be seen that the relative contribution of red emission from the red phosphorescent emitter (emission peak at ca. 610-620 nm) is higher for the Device Examples than for Comparative Device 1.

Figure 3:
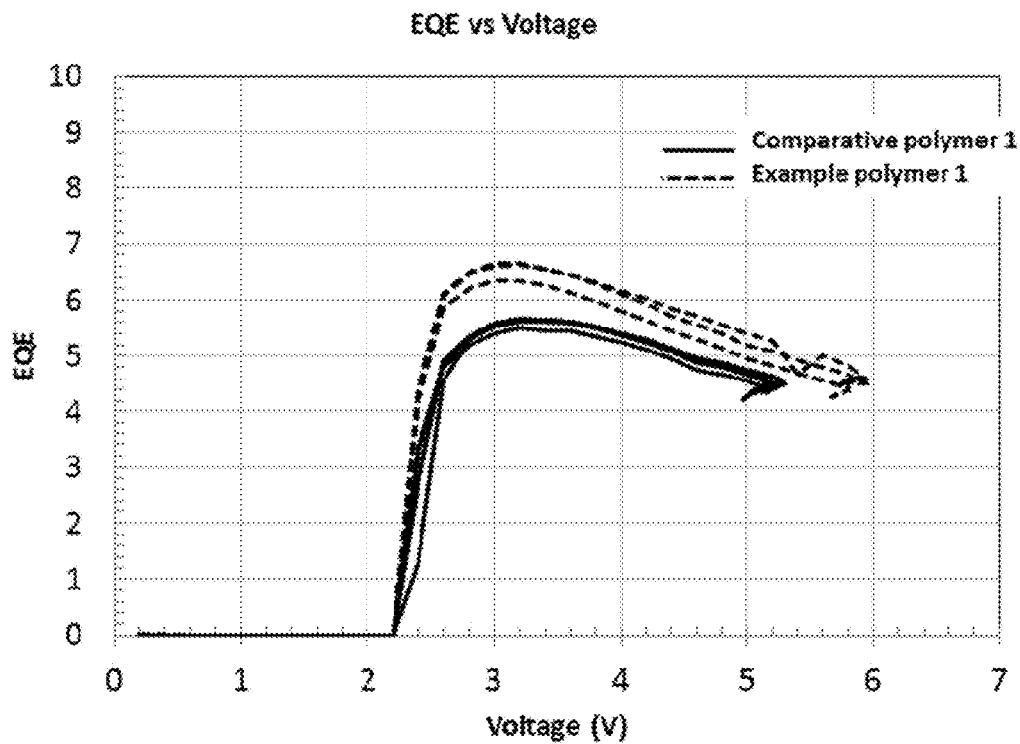
FIG. 3 is a graph of external quantum efficiency vs. voltage for a device according to an embodiment of the invention and a comparative device.
Figure 4:
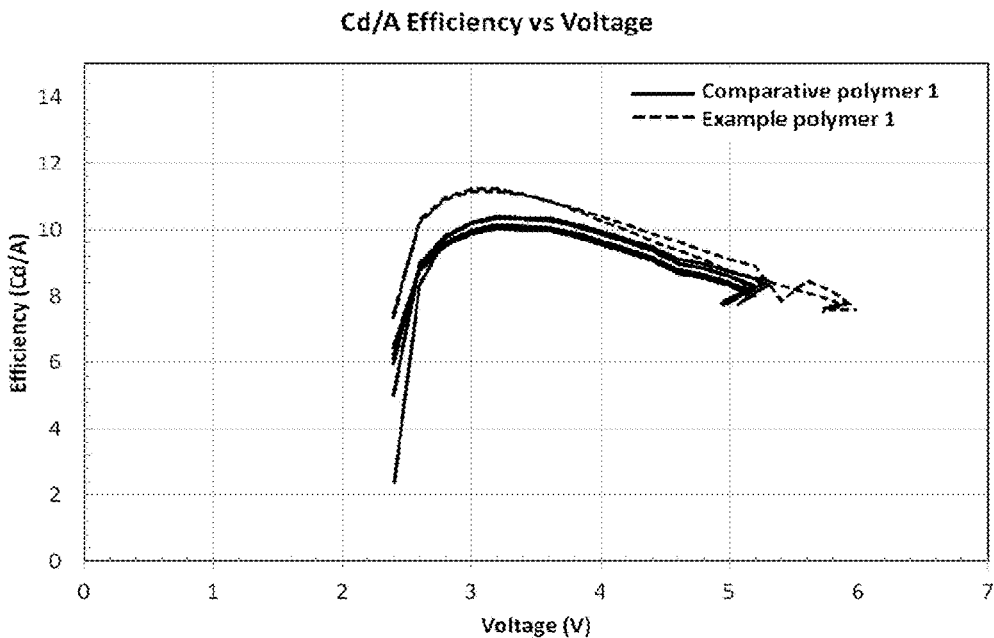
FIG. 4 is a graph of candela per amp efficiency vs voltage for a device according to an embodiment of the invention and a comparative device.

With reference to FIG. 3 and FIG. 4, efficiency of Device Example 1 is higher than Comparative Device 1 when measured as external quantum efficiency vs voltage (FIG. 3) and when measured as Cd/A vs voltage (FIG. 4).

The present inventors have found that conjugation breakers are particularly advantageous when used with electron-deficient conjugating repeat units, such as arylene repeat units substituted with polar ether groups. Without wishing to be bound by any theory, polar groups may have an inductive electron-withdrawing effect lower the LUMO level of a repeat unit (that is to say, move the LUMO level further from vacuum level), thereby reducing the HOMO-LUMO gap. Quenching of phosphorescence by conjugated polymers comprising electron-deficient conjugating repeat units may be due at least in part to reduction of the triplet excited state energy level of such polymers by polar groups. This quenching may be at least partially offset by introduction of conjugation-breaking repeat units.

The relative contribution of red emission is about the same for Device Example 1 (20 mol % conjugation breaking units) and Device Example 2 (10 mol % conjugation breaking units).

Figure 5:
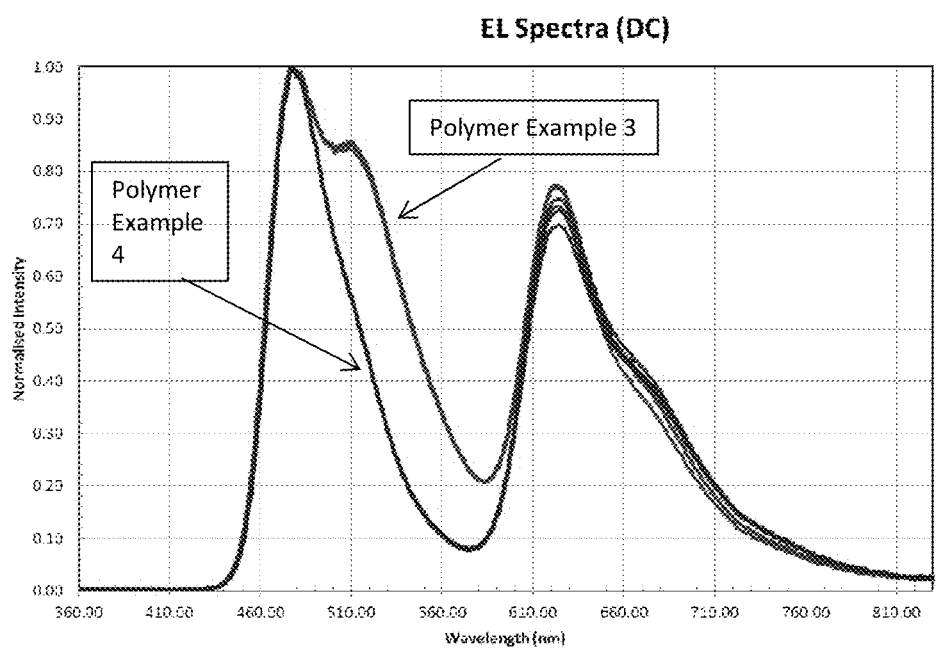
FIG. 5 shows the electroluminescent spectra of two devices according to embodiments of the invention.

The electroluminescent spectra of Device Example 3 (containing green fluorescent repeat units) and Device Example 4 (containing no green fluorescent repeat units) is shown in FIG. 5. The relative contribution of red emission in both spectra is about the same, indicating that there is no substantial quenching of red phosphorescent emission by the green fluorescent repeat unit, at least at the concentration of the green unit provided in these examples, indicating that the observed improvement in efficiency in the example polymers is due to the presence of conjugation breaking repeat units in those polymers.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A light-emitting composition comprising a polymer and a phosphorescent light-emitting material wherein the polymer comprises conjugating repeat units of formula (I) and 1 to 20 mol % of conjugation-blocking repeat units of repeat units of formula (II):

wherein Ar$^1$ is selected from fluorene and phenylene;
R$^1$, which may be the same or different in each occurrence, is a substituent; p is 0 or a positive integer; Ar$^2$ in each occurrence independently comprises substituted or unsubstituted phenyl; and
Sp$^1$ is a C$_{1-20}$ alkyl group of which one or more non-adjacent C atoms may be replaced with O.

2. A light-emitting composition according to claim 1 wherein p is 0, 1, 2, 3 or 4.

3. A light-emitting composition according to claim 1 wherein p is at least 1 and each R$^1$ is a non-polar substituent.

4. A light-emitting composition according to claim 2 wherein Ar$^1$ is unsubstituted or substituted with one or more C$_{1-30}$ hydrocarbyl substituents.

5. A light-emitting composition according to claim 1 wherein p is at least 1 and at least one R$^1$ is a polar substituent.

6. A light-emitting composition according to claim 5 wherein p is at least 2 and each R$^1$ is a polar substituent.

7. A light-emitting composition according to claim 5 wherein at least one substituent R$^1$ has formula (III):

wherein * represents a point of attachment of the substituent to Ar$^1$; Sp$^2$ is a spacer group; PG is a polar group; b is 0 or 1; and c is at least 1.

8. A light-emitting composition according to claim 7 wherein Sp$^2$ is a C$_{1-10}$ hydrocarbyl group.

9. A light-emitting composition according to claim 7 wherein PG in each occurrence is a C$_{1-20}$ alkyl chain wherein one or more non-adjacent carbon atoms of the alkyl chain are replaced with oxygen atoms.

10. A light-emitting composition according to claim 9 wherein R$^1$ in each occurrence has formula (III):

wherein m independently in each occurrence is at least 1; p is at least 1; and R$^4$ in each occurrence is independently H or a substituent.

11. A light-emitting composition according to claim 5 wherein the polymer further comprises a repeat unit of formula (XII):

wherein Ar$^3$ is an aryl or heteroaryl group; R$^2$ in each occurrence is independently a non-polar substituent; and q is 0 or an integer.

12. A light-emitting composition according to claim 11 wherein R$^2$ in each occurrence is a C$_{1-40}$ hydrocarbyl.

13. A light-emitting composition according to claim 11 wherein Ar$^3$ is selected from fluorene and phenylene.

14. A light-emitting composition according to claim 1 wherein the fluorene repeat unit Ar$^1$ has formula (IV):

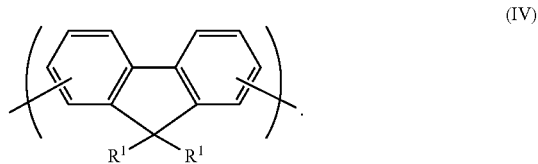

15. A light-emitting composition according to claim 1 wherein Ar$^2$ is substituted or unsubstituted aryl.

16. A light-emitting device comprising an anode, a cathode and a light-emitting layer between the anode and the cathode, the light-emitting layer comprising a light-emitting composition according to claim 1.

17. A light-emitting device according to claim 16 wherein the device is a light-emitting electrochemical cell and the light-emitting layer comprises a salt and an electrolyte.

* * * * *